United States Patent [19]

Nazoa-Ruiz

[11] Patent Number: 4,847,568
[45] Date of Patent: Jul. 11, 1989

[54] MICROWAVE APPARATUS

[75] Inventor: Nils Nazoa-Ruiz, New Malden, England

[73] Assignee: National Research Development Corporation, London, England

[21] Appl. No.: 52,425

[22] Filed: May 21, 1987

[30] Foreign Application Priority Data

Jun. 2, 1986 [GB] United Kingdom ................. 8613314

[51] Int. Cl.$^4$ ............................................. H03F 3/60
[52] U.S. Cl. .................................... 330/277; 307/319;
330/54; 330/286; 330/297
[58] Field of Search ................. 330/277, 286, 297, 54;
307/319; 336/177, 229

[56] References Cited

U.S. PATENT DOCUMENTS

| | | | |
|---|---|---|---|
| 3,495,183 | 2/1970 | Doundoulakis et al. | 330/286 X |
| 3,527,966 | 9/1970 | Forge | 307/319 |
| 3,781,740 | 12/1973 | Kirmis et al. | 336/229 X |
| 4,543,535 | 9/1985 | Ayasli | 330/277 X |
| 4,578,664 | 3/1986 | Kinzler et al. | 336/229 X |

FOREIGN PATENT DOCUMENTS

| | | | |
|---|---|---|---|
| 3T18845 | 12/1982 | Fed. Rep. of Germany | 330/124 R |
| 162413 | 10/1982 | Japan | 336/229 |
| 1143915 | 2/1969 | United Kingdom. | |
| 2014797 | 8/1979 | United Kingdom. | |

OTHER PUBLICATIONS

*IEEE Transactions on Microwave Theory and Techniques*, vol. MT-32, No. 3, 3/84, pp. 268-373, "MESFET Distributed Amplifier Design Guidelines".
*Instruments and Experimental Techniques*, vol. 23, No. 5, Pt. 1, 10-11/80, pp. 1170-1174, Plenum Publishing Corp., "MOS Transistor Linear Pulsed Amplifiers with Distributed Gain".
*Electronic Design*, vol. 28, No. 5, 3/1/80, pp. 87-91, "Capacitors and Inductors Lead the Way to Compact High Frequency Switchers".
Patent abstracts of Japan, vol. 7, No. 284, (E-217)[1429]12/17/83.
Walls et al, "Design Considerations in State-of-the-Art Signal Processing and Noise Measurement Systems", Conference: Proceedings of the 30th Annual Symposium on Frequency Control, Atlantic City, N.J. Jun. 2-4, 1976, pp. 269-274.

*Primary Examiner*—James B. Mullins
*Attorney, Agent, or Firm*—Larson and Taylor

[57] ABSTRACT

In order to supply a d.c. bias to the drain electrodes of MESFETS (1-4) in a distributed amplifier operating in the 500 MHz to 20 GHz or above, a d.c. source (15) is connected to the drain line (5,9,11,14) via a feed component (16) which comprises a ferrite bead (17) having an axial aperture (18). A coil (19) comprising, for example, four turns of 20 micron gold wire is wound on the bead in toroidal fashion. The bead may be of the kind which is used for low-frequency interference suppression or for encircling the emitter lead-out wire of a bipolar transistor operating in the lower megahertz range. At these relatively low frequencies in the conventional use of the bead, the bead material will exhibit low magnetic losses and high permeability. However, in the present invention, due to the microwave signal in the coil, the bead operates over a frequency band which is many times higher than its normal operating band. At these high frequencies the bead material exhibits quite large losses. The feed component acts, as far as the microwave signal is concerned, as though it is a relatively large resistor, which isolates the low impedance of the d.c. source from the microwave signal path in the drain line. As far as the bias supply is concerned, the d.c. resistance of the coil is negligible, so that there is virtually no d.c. power dissipated in the feed component. The feed component can be used for other applications where a high resistance at microwave frequencies is required, together with substantially zero d.c. resistance.

20 Claims, 2 Drawing Sheets

MICROWAVE APPARATUS

BACKGROUND OF THE INVENTION

This invention relates to the feeding of direct current or signals between points in a microwave circuit, such as a distributed amplifier (DA) or a pulse generator.

The feeding of a direct current supply to a microwave circuit, i.e. a circuit operating in the frequency range of, for example, 500 MHz to at least 20 GHz, presents serious problems. If a simple wire or strip line is used to connect the d.c. source to the circuit, a number of effects can be produced, depending upon the effective length of the wire or strip line as compared with the wavelength of the microwave signal in the circuit. For example, the d.c. source may present a virtually zero impedance across the signal path, so that the microwave signal is lost. However, if the wire or strip line could be dimensioned to act as a quarter-wavelength line, the d.c. source would appear as an open-circuit as far as the signal path is concerned. This would have the desired effect, but it would be obtained only for signal frequencies within a very narrow band, over which the line approximates to a quarter-wavelength line. This would seriously limit the signal bandwidth, and would be useless where a bandwidth of, say, 5 or 6 octaves is required. If the wire or strip line presents a mismatch to the signal path, standing waves will be set up, and it is possible that the signal voltage thereby produced will damage transistors or other active components in the microwave circuit.

It is therefore necessary to take special steps to ensure that the connection of the d.c. source to the microwave circuit does not appreciably affect the microwave signal path.

Two alternative methods of achieving this have previously been proposed. In one method, a large resistance has been connected between the d.c. source and the signal path, the resistance value being, say, at least ten times the characteristic impedance of the signal path. However, all of the d.c. current for the microwave circuit flows through the resistor, which therefore dissipates an appreciable amount of power. Besides being wasteful and possibly causing an unacceptable temperature rise in the circuit components, the inclusion of the resistor, with its resultant voltage drop, means that the voltage of the d.c. source must be increased. These problems become progressively worse as the number of active components in the circuit is increased.

The second method involves the use of a bias-T circuit. This comprises an inductance which is connected between the d.c. source and the components which are to be driven, and a capacitance which is connected to the signal end of the inductance and is in series with the microwave signal path. Although this would appear to be a simple arrangement, bias-T devices are, in practice, very expensive devices (currently around £ 500), because a very high standard of construction is essential. The inductance component must be purely inductive over the whole signal frequency band so that it always presents a high reactance to the signal; the capacitance must be relatively large, so that its reactance is small compared with the characteristic impedance of the signal path over the whole frequency range, and the quality of the capacitance must be high so that the component does not become inductive or resistive within the desired frequency range; the device is constructed, for example, on a quartz substrate, with the components interconnected by a gold microstrip line; and the device must be contained within a screening box of brass or other suitable metal, provided with high-quality signal inlet and outlet ports and d.c. input port.

It is an object of the present invention to provide microwave apparatus including a simple and inexpensive feeding means for a microwave circuit.

SUMMARY OF THE INVENTION

According to the invention there is provided a microwave apparatus comprising a microwave circuit which operates in a frequency range of approximately 500 MHz to at least 20 GHz; and a feed component comprising a bead having a hole therethrough and having a winding comprising a number of turns of high-conductivity wire wound in toroidal fashion thereon, respective ends of the winding being connected between first and second points in the microwave circuit, the bead being formed of a magnetic material which exhibits substantial magnetic losses over said frequency range, whereby the feed component acts as a resistance to the passage of microwave signals in said frequency range but has negligible resistance to direct current flow between said points.

Preferably, the material from which the bead is formed is a ferrite material. The wire is preferably a gold wire, which may be, for example, of 20 microns thickness.

BRIEF DESCRIPTION OF THE DRAWINGS

Embodiments of the invention will now be described, by way of example, with reference to the accompanying drawings, in which.

DESCRIPTION OF PREFERRED EMBODIMENTS

High-frequency broadband amplifiers have conventionally included resonant circuits. Due to the use of resonant circuits, the bandwidth which can be achieved between the points which are, say, 3 dB down relative to the peak has been quite limited, and a frequency band from, say, 500 MHz to 20 GHz or above cannot be achieved in such circuits.

More recently, however, amplifiers have been designed which do not use resonant circuits, and which, by use of semiconductor devices having a very high operating speed, can achieve the very wide frequency band mentioned above.

Figure 1:
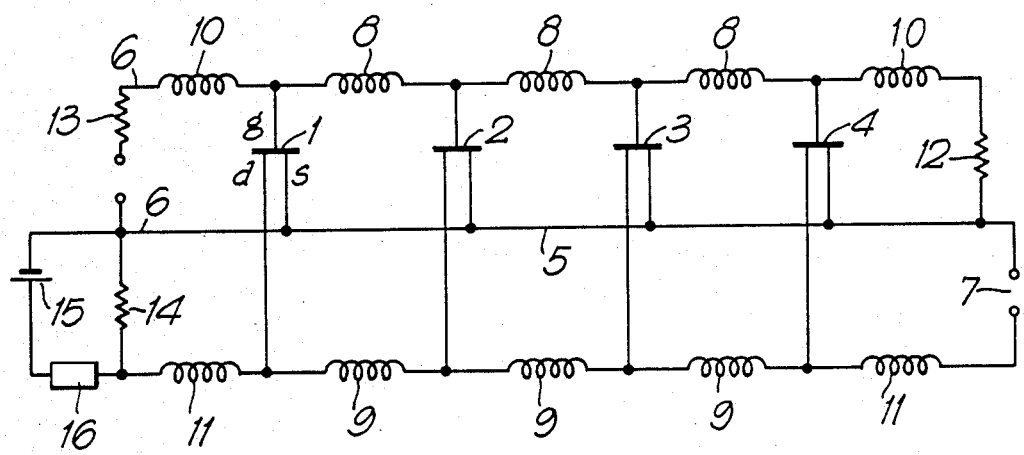
FIG. 1 is a schematic diagram of a distributed amplifier to which the invention is applied.

These amplifiers are "distributed" amplifiers, comprising a number of field effect transistors connected as shown schematically in FIG. 1 of the drawings. The transistors are preferably GaAs MESFETS. The amplifier may comprise any desired number of these transistors such as the transistors 1 to 4 shown in the figure. The amplifier basically comprises two microwave transmission lines; a "gate" transmission line in which the gate electrodes of the transistors 1 to 4 are connected, and a "drain" transmission line in which the drain electrodes are connected. The source electrodes are connected to a "ground" line 5, which is common to the two transmission lines and to a microwave signal input 6 and a microwave signal output 7. The gate electrodes of successive transistors are interconnected via inductors 8, and the drain electrodes are interconnected by similar inductors 9. Inductors 10 and 11 are provided in the end sections of the lines.

The gate transmission line is terminated at its right-hand end by a resistor 12 equal to the characteristic impedance of the line, which may be, for example 50 Ω. The resistor 12 may be referred to as the "idle gate load". The microwave signal is fed into the input 6 via a resistor 13 equal to that characteristic impedance. The drain transmission line is terminated at its left-hand end by a resistor 14 equal to the characteristic impedance of that line; again 50 Ω, for example. The resistor 14 may be referred to as the "idle drain load". The signal output 7 is connected to a load circuit (not shown), which will have an input impedance equal to the characteristic impedance of the drain transmission line.

In use of the amplifier, a microwave signal fed into the input 6 is amplified by the successive transistors 1 to 4. A respective travelling wave passes along each of the gate and drain transmission lines, and if each line is correctly terminated the gain of the amplifier will be substantially independent of the signal frequency. A gain of some 6dB is obtained over a very wide frequency band.

It is not essential to provide any d.c. bias for the gate electrodes, but if an especially low noise level is required, the gates may be negatively biased. In that case, since the gates are negatively biased, the bias source does not provide any current, so it can readily be connected to the gate circuit by connecting a capacitor (not shown) between the resistor 12 and the line 5 and connecting the d.c. source, for example a battery, across the capacitor.

On the other hand, however, in order to make the amplifier operative, it is essential to bias the drain electrodes in the forward direction, so that drain current flows from the d.c. bias source. It would be possible to inject the d.c. supply into the lower end of the idle drain load 14, in a similar manner to that proposed above for the negative gate bias. However, the load resistance 14, which would then be in series with the supply, would cause the above-mentioned dissipation and voltage drop problems, which would be increased as further amplifier stages are added. In the present embodiment, one pole of the bias source 15, which may be a battery, is connected to the line 5 and the other pole is connected to the junction of the resistor 14 and the inductor 11 via a feed component 16, which will now be described.

Figure 2:
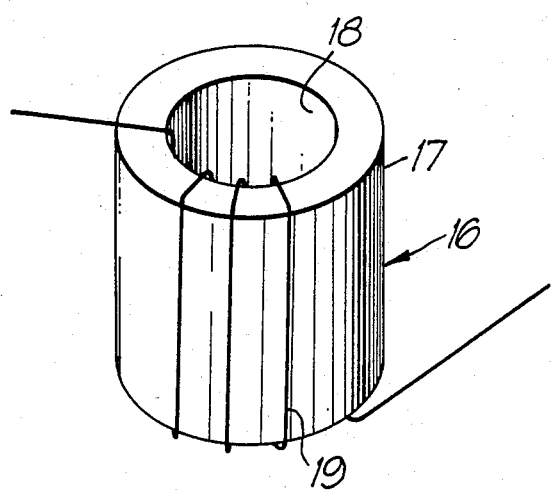
FIG. 2 is a schematic pictorial view of a feed component of the invention.

Referring to FIG. 2, the component 16 comprises a ferrite bead 17 having an axial aperture 18. A coil 19 comprising, for example, four turns of 20 micron gold wire is wound on the bead in toroidal fashion. The bead (without the coil) may be of the kind which is used for low-frequency interference suppression or for encircling the emitter lead-out wire of a bipolar transistor operating in the lower megahertz range. In the latter case, the bead is provided in order to stabilise the operation of the transistor. At these relatively low frequencies the bead material will exhibit low magnetic losses and high permeability, so that a relatively high inductance value may be achieved using only a single turn of wire through the bead.

In the present case, however, due to the microwave signal in the coil 19 the bead is operating over a frequency band which is many times higher than its normal operating band, and at these high frequencies the bead material exhibits quite large losses. The component 16 comprising the bead 17 and the coil 19 wound thereon acts, as far as the microwave signal is concerned, as though the component is a relatively large resistor isolating the low impedance of the source 15 from the microwave signal path. As far as the source 15 is concerned, however, the d.c. resistance of the coil 19 is negligible, so that there is virtually no d.c. power dissipated in the component 16.

It is to be noted that the purpose of the bead 17, and its mode of operation, are completely different from its conventional application as an interference suppressor or a transistor stabiliser. In the conventional applications a relatively high inductance and very low losses are required, whereas in the present invention high losses produced at the greatly elevated operating frequencies cause the component to simulate a large resistance.

Figure 3:
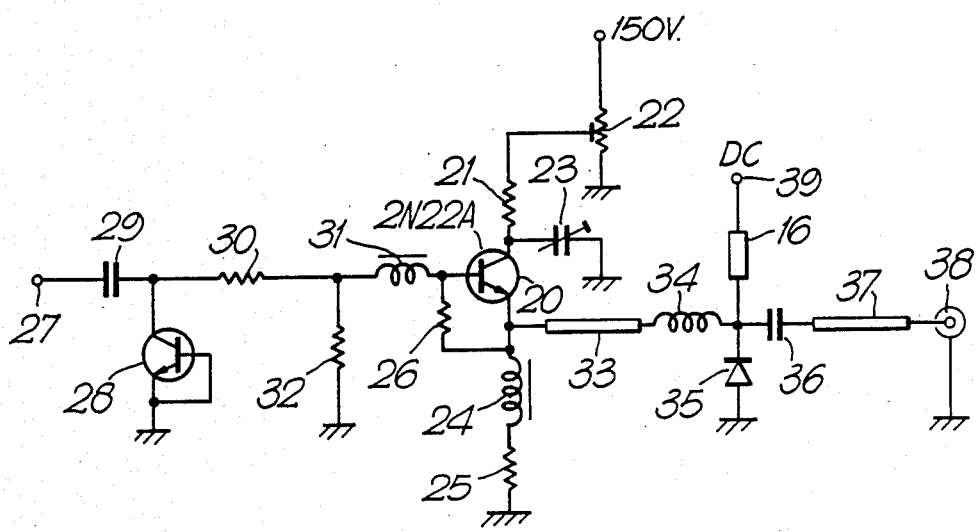
FIG. 3 is a circuit diagram of a microwave pulse generator to which the invention is applied.

Another example of a microwave circuit in which the component 16 is used for feeding a d.c. supply is shown in FIG. 3. In this case, the microwave circuit is a pulse generator for generating very sharp, high-voltage pulses. The circuit comprises a bipolar switching transistor 20, the collector of which is connected via a resistor 21 to a d.c. supply comprising a preset potentiometer 22 across a 150 volt d.c. source. A preset capacitor 23 is connected between the collector and ground. The emitter of the transistor 20 is connected to ground via a ferrite bead device 24 and a resistor 25. The base is connected to the emitter via a resistor 26. A trigger input terminal 27 is connected to the collector of a diode-connected transistor 28 via a capacitor 29. The collector is connected via a resistor 30 and a ferrite bead device 31, in series, to the base of the transistor 20, and the junction between the resistor 30 and the device 31 is connected to ground via a resistor 32.

In operation of the circuit so far described, the transistor 20 is biased so that it is maintained just below the negative resistance region of the collector current/collector voltage characteristic. When a positive-going trigger pulse is applied to the terminal 27, base current flows into the transistor 20 and the operating point moves up to another curve of the characteristic in which the bias does not hold the transistor below the negative resistance region. Avalanche breakdown in the transistor 20 then occurs, with the already charged-up capacitor 23 holding the collector potential up momentarily. The avalanche current flowing through the emitter resistor 25 produces at the emitter a very narrow positive-going pulse (for example 400 psecs at the half-height width) of some 40 volts amplitude.

The trigger pulse fed to the terminal 27 has a relatively slow rise time, and the ferrite bead device 31 acts as a low-loss component over the range of relatively low frequencies involved. The rising trigger pulse is therefore fed virtually unattenuated to the base of the transistor 20. However, when avalanche occurs in the transistor, its base voltage rises abruptly in sympathy with its emitter voltage. In this high-frequency mode, the bead device 31 acts as a lossy component which prevents the abrupt voltage change at the base from appearing across the resistor 32 and on the other input components 27–30, i.e. it decouples the base from the components 27–30 and 32 and therefore prevents undesirable loading of the base voltage swing and the emitter output signal.

The ferrite bead device 24 prevents the resistor 25 from loading the output of the pulse generator in the high rate of current change avalanche condition, but as far as the d.c. biasing of the transistor 20 is concerned it acts as a substantially zero resistance.

The emitter of the pulse generator transistor 20 is connected via a microstrip line 33 and a small inductance 34 to the cathode of a step-recovery (or charge-storage) diode 35, the anode of which is connected to ground. The cathode of the diode is also connected via a capacitor 36 and a microstrip line 37 to an output port 38.

The effect of the step recovery diode 35 is as follows. Let us assume, firstly, that its cathode is initially negatively (i.e. forward) biased by a d.c. source 39. When the positive-going step from the transistor 20 is applied to the cathode of the diode, the diode recovers to the reverse-biased condition, but this recovery takes place in two stages. During the first stage, despite the application of the large positive (reverse) voltage pulse to the cathode of the diode, the diode behaves as though it is still forward biased, due to charge stored therein. In the second stage, the diode conducts heavily in the reverse direction for a very short period and then "snaps off". A very short, large amplitude, negative-going pulse is thereby produced at the cathode of the diode. This pulse is differentiated by the capacitor 36, and the resulting pulse at the output port is considerably narrower than the pulse at the emitter of the transistor 20 (for example 80 psecs at the half-height width).

However, it will be apparent that the pulse at the cathode of the diode 35 contains very high frequency components in the GHz range. The connection of the d.c. bias source 39 to the cathode therefore presents the problems outlined above in respect of microwave circuits generally.

In this embodiment of the present invention, the problems are avoided by connection of the source 39 to the cathode of the diode via a feed component 16 as previously described with reference to FIG. 2 of the drawings.

Although two specific forms of microwave circuit to which the invention is applied have been described by way of example, it will be apparent that the invention would be applicable to other forms of microwave circuit to which a d.c. source is connected.

Although a specific type of bead formed from a ferrite material has been described above, any other bead material which exhibits high magnetic losses throughout the microwave frequency band of interest could be used.

The use of the feed component 16 provides a very cheap and simple method of feeding a d.c. supply to a microwave circuit. The cost of the bead would be only a few pence, and even when the coil of gold or other wire has been wound thereon, the total cost of the component would be only a very small fraction of the cost of the bias-T device mentioned above.

It will be noted that the bead devices 24 and 31, which are preferably of similar construction to the feed component 16, are used for rather different purposes. In each case, however, the high resistance effect of the bead device at microwave frequencies is relied upon.

I claim:

1. Microwave apparatus comprising a microwave circuit, said circuit including first and second points, and said circuit operating in a frequency range of approximately 500 MHz to at least 20 GHz; and a dc biasing circuit for said microwave circuit, said dc biasing circuit including a feed component for controlling feeding of microwave signals in said frequency range, said feed component comprising a bead having a hole therethrough and having a winding comprising a number of turns of high-conductivity wire wound in toroidal fashion thereon, respective ends of said winding being connected between said first and second points in said microwave circuit, said bead being formed of a magnetic material which exhibits substantial magnetic losses over said frequency range, whereby said feed component acts as a resistance to the passage of microwave signals in said frequency range and has negligible resistance to direct current flow between said points.

2. Apparatus as claimed in claim 1, wherein said material from which said bead is formed in a ferrite material.

3. Apparatus as claimed in claim 1, wherein said wire is a gold wire.

4. Apparatus as claimed in claim 3, wherein said wire is of 20 microns thickness.

5. Microwave apparatus comprising a microwave circuit which operates in a frequency range of approximately 500 MHz to at least 20 GHz; and a feed component, said microwave circuit including a switching transistor which includes an emitter connected in an emitter circuit including a biasing resistor, and which undergoes avalanche breakdown in response to an input signal to thereby provide an output signal at said emitter; said feed component comprising a bead having a hole therethrough and having a winding comprising a number of turns of high-conductivity wire wound in toroial fashion thereon, respective ends of said winding being connected in series with said biasing resistor of said microwave circuit, said bead being formed of a magnetic material which exhibits substantial magnetic losses over said frequency range such that said feed component acts as a resistance to the passage of microwave signals in said frequency range and has negligible resistance to direct current flow between the respective ends thereof, whereby said feed component reduces loading of said output signal by said biasing resistor during said avalanche breakdown.

6. Apparatus as claimed in claim 5, wherein said material from which said bead is formed is a ferrite material.

7. Apparatus as claimed in claim 5, wherein said wire is a gold wire.

8. Apparatus as claimed in claim 7, wherein said wire is of 20 microns thickness.

9. Microwave apparatus comprising a microwave circuit which operates in a frequency range of approximately 500 MHz to at least 20 GHz; and a feed component, said microwave circuit including an input circuit, a switching transistor which undergoes avalanche breakdown in response to an input signal applied to its base electrode from said input circuit; said feed component comprising a bead having a hole therethrough and having a winding comprising a number of turns of high-conductivity wire wound in toroidal fashion thereon, respective ends of said winding being connected between said input circuit and said base electrode of said switching transistor in said microwave circuit, said bead being formed of a magnetic material which exhibits substantial magnetic losses over said frequency range, whereby said feed component acts as a resistance to the passage of microwave signals in said frequency range and has negligible resistance to direct current flow between its respective ends, whereby said feed component decouples said input circuit from said base electrode in response to an abrupt voltage change occurring at said base electrode during said avalanche breakdown.

10. Apparatus as claimed in claim 9, wherein said material from which said bead is formed is a ferrite material.

11. Apparatus as claimed in claim 9, wherein said wire is a gold wire.

12. Apparatus as claimed in claim 11, wherein said wire is of 20 microns thickness.

13. Microwave apparatus comprising a microwave circuit, said circuit including first and second points and said circuit operating in a frequency range of approximately 500 MHz to at least 20 GHz; and a feed component, said microwave circuit comprising a distributed amplifier including a plurality of field-effect transistors connected to a gate transmission line and a drain transmission line; said field effect transistors each including a drain electrode, said first point being a supply point to which is applied voltage from a direct current source, and said second point being a point on said drain transmission line, whereby when voltage is applied to said first point from said direct current source the drain electrodes of the field effect transistors are biassed in a forward direction; said feed component comprising a bead having a hole therethrough and having a winding comprising a number of turns of high-conductivity wire wound in toroidal fashion thereon, respective ends of said winding being connected between said first and second points in said microwave circuit, said bead being formed of a magnetic material which exhibits substantial magnetic losses over said frequency range, whereby said feed component acts as a resistance to the passage of microwave signals in said frequency range and has negligible resistance to direct current flow between said points.

14. Apparatus as claimed in claim 13, wherein said material from which said bead is formed is a ferrite material.

15. Apparatus as claimed in claim 13, wherein said wire is a gold wire.

16. Apparatus as claimed in claim 15, wherein said wire is of 20 microns thickness.

17. Microwave apparatus comprising a microwave circuit, said circuit including first and second points and said circuit operating in a frequency range of approximately 500 MHz to at least 20 GHz; and a feed component, said microwave circuit comprising a pulse generator including a step-recovery diode; said first point being a supply point to which voltage is applied from a direct current source, and said second point being connected to an electrode of said diode, whereby when voltage is applied to said first point from said direct current source said diode is biassed in a forward direction, said feed component comprising a bead having a hole therethrough and having a winding comprising a number of turns of high-conductivity wire wound in toroidal fashion thereon, respective ends of said winding being connected between said first and second points in said microwave circuit, said bead being formed of a magnetic material which exhibits substantial magnetic losses over said frequency range, whereby said feed component acts as a resistance to the passage of microwave signals in said frequency range and has negligible resistance to direct current flow between said points.

18. Apparatus as claimed in claim 17, wherein said material from which said bead is formed is a ferrite material.

19. Apparatus as claimed in claim 17, wherein said wire is a gold wire.

20. Apparatus as claimed in claim 19, wherein said wire is of 20 microns thickness.

* * * * *